United States Patent [19]

Bobeck

[11] 4,187,555

[45] Feb. 5, 1980

[54] CONDUCTOR ACCESS MAGNETIC BUBBLE MEMORY ARRANGEMENT

[75] Inventor: Andrew H. Bobeck, Chatham, N.J.

[73] Assignee: Bell Telephone Laboratories, Incorporated, Murray Hill, N.J.

[21] Appl. No.: 14,606

[22] Filed: Feb. 23, 1979

[51] Int. Cl.² ............................................. G11C 19/08
[52] U.S. Cl. ....................................................... 365/19
[58] Field of Search ............................ 365/19, 20, 21

[56] References Cited

U.S. PATENT DOCUMENTS 4,143,419  3/1979  Bobeck ................................. 365/19
4,143,420  3/1979  Bobeck ................................. 365/19

Primary Examiner—James W. Moffitt
Attorney, Agent, or Firm—Herbert M. Shapiro

[57] ABSTRACT

A conductor access, magnetic bubble memory is organized in a major-minor mode by including transfer locations in the conducting layers which define the normal bubble propagation implementation. An attractive partitioning of each of the two conducting layers permits the minor loops and the major loop to be operated synchronously or independently resulting in short duty cycles which permit low power operation to be achieved.

8 Claims, 3 Drawing Figures

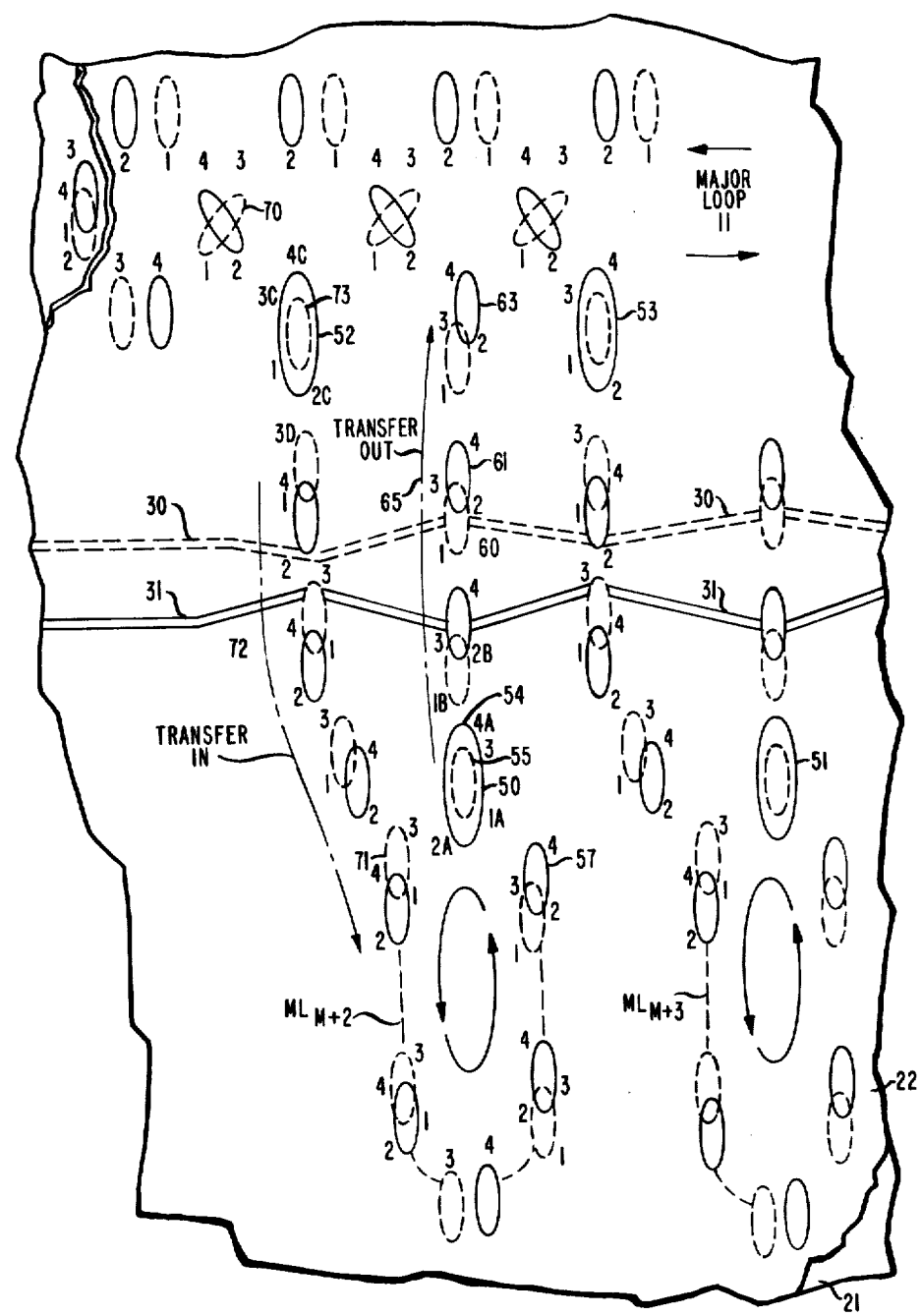

CONDUCTOR ACCESS MAGNETIC BUBBLE MEMORY ARRANGEMENT

FIELD OF THE INVENTION

This invention relates to magnetic bubble memories, and more particularly to such memories characterized by transfer gate implementations whereby bubbles are moved from one propagation path to another.

BACKGROUND OF THE INVENTION

Magnetic bubble memories as well as the "major-minor" organization of such memories are well known in the art as is disclosed in U.S. Pat. No. 3,618,054 of P. I. Bonyhard, U. F. Gianola, and A. J. Perneski, issued Nov. 2, 1971.

The major-minor organization is characterized by a set of closed "minor" loops in which bubble patterns are recirculated synchronously in response to a magnetic field reorienting cyclically in the plane of bubble movement. The bubbles in each loop are moved through a transfer position which couples a minor loop to a stage of an accessing loop called the major loop. An electrical conductor couples all the transfer positions and is operative, when pulsed, to transfer the bubble pattern, occupying all the transfer positions, into the major loop for movement to a detector. The transfer operation from a minor loop to a major loop is commonly referred to as a "transfer out" operation and results in vacancies in those positions in the minor loops from which the transferred bubble pattern originated.

A bubble generator, on the other hand, provides a bubble pattern for movement into those vacancies. The generator is coupled to the major loop and is operative, responsive to sequence of input signals, to enter a replacement bubble pattern into the major loop. The major loop also is responsive to the cyclical field to move bubbles. Consequently, an input signal during each cycle of the field results in a bubble pattern moving in the major loop towards the transfer positions as the vacancies move in the minor loops toward the transfer positions. An appropriately timed transfer operation moves the replacement bubble pattern into the vacancies. The major-minor organization is useful primarily to decrease the latency time and access time of "field access" type bubble memories which are characterized by a reorienting "in plane" field as described hereinbefore.

Another type of magnetic bubble memory employs electrical conductors rather than a reorienting in-plane field to effect bubble propagation. In the past, conductor access type bubble memories including discrete electrical conductors which could be pulsed selectively to produce bubble movement. There was no need for the major-minor organization in this type of memory. In my copending application Ser. No. 914,959, filed June 12, 1978, on the other hand, no discrete conductors exist; and yet a major-minor organization is particularly attractive. Consequently, a transfer gate is necessary. But no discrete conductors are present to implement a transfer gate. The problem, then, to which the present invention is directed is to provide a transfer gate compatible with the memory disclosed in my above-mentioned patent without employing any additional electrical conductors.

BRIEF DESCRIPTION OF THE INVENTON

A compatible transfer gate is realized in a conductor access arrangement of the type described in my above-mentioned copending application by forming, for example, concentric apertures in the two electrically conducting layers operative to move bubbles as disclosed in that application. For propagation, currents are impressed in the two conducting layers (separated by an electrically insulating layer) alternately first in one direction, then in the opposite direction. The layers have offset apertures operative to produce changing field gradients to move bubbles. by forming concentric apertures, one smaller than the other, rather than offset apertures, in transfer positions, an alternative sequence of pulses causes bubbles in transfer positions to move to different paths while the bubbles not in transfer positions are moved in only a negligible manner consistent with the preservation of data when propagation continues.

A magnetic bubble memory accordingly comprises a layer of material in which magnetic bubbles can be moved and means for moving bubbles in the layer, the means comprising first and second layers of electrically conducting material coupling the layer of material in which bubbles move and electrical drive means adapted for impressing pulses alternately in first and second directions in the first and second layers, wherein the layers include associated first and second aperture patterns offset from one another to provide bubble movement along at least first and second paths associated with a transfer position, the memory being characterized in that the first and second aperture patterns include small and relatively large concentric apertures at the transfer position and means responsive to a transfer signal for changing the sequence of pulses applied to the first and second layers in a manner to effect bubble transfer from one of the first and second paths to the other.

BRIEF DESCRIPTION OF THE DRAWING

FIG. 2 is a top view of portions of the arrangement of FIG. 1; and

DETAILED DESCRIPTION

Figure 1:
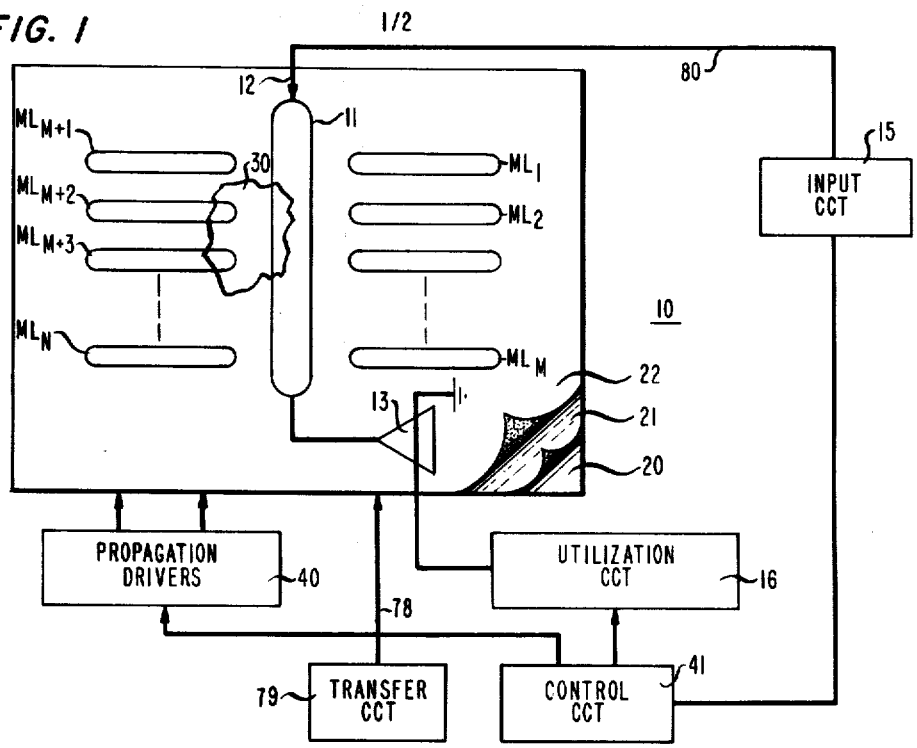
FIG. 1 is a schematic representation of a magnetic bubble memory arrangement in accordance with this invention.

FIG. 1 shows a block diagram of a generalized major-minor organized, magnet bubble memory 10. The memory includes the usual minor loops $ML_1$, $ML_2$ - - - $ML_M$, $ML_{M+1}$ - - - $ML_N$, and a major loop 11. A bubble generator arrangement 12 and a bubble detector arrangement 13 couple the major loop and are connected to an input circuit 15 and to a utilization circuit 16 respectively. A bias field source 17 maintains the bubbles at a nominal diameter in well known manner.

Operation of a major-minor bubble memory requires transfer or replication of bubble patterns, for example, from the minor loops to the major loop for detection. We are interested herein primarily with a transfer operation and that in the context of a conductor access propagation implementation for bubble movement. Consequently, a brief discussion of that conductor access implementation is appropriate for a full understanding of the transfer operation.

Bubble movement takes place in a host layer 20 in response to currents impressed in electrically conducting layers 21 and 22. The layers are appropriately insulated from one another and include apertures which are disposed so that current pulse alternately in layers 21 and 22 and in an appropriate sequence of directions causes movement along the paths represented by the loops in FIG. 1. The overall bubble propagation operation is disclosed in my above-mentioned copending application. But, in general, the apertures are shaped and disposed so that an otherwise uniform current flow in layers 21 or 22 is modified locally at each aperture to generate a localized magnetic field gradient to move a bubble. The apertures are disposed so that successive current pulses cause a changing pattern of localized field gradients which move a bubble pattern along the paths indicated in FIG. 1.

A transfer function is implemented by a different relationship between the apertures in layers 21 and 22 at locations in which a transfer operation is to occur. The operation itself results from a change in the normal propagation pulse sequence as is now discussed in connection with FIG. 2.

FIG. 2 shows an enlargement of area 30 of the memory of FIG. 1. The figure shows specifically the features of layers 21 and 22. The features of layers 21 are represented by broken lines to indicate that layer 21 is beneath layer 22. The features of layer 22 are represented by unbroken lines. Remember that an insulating layer separates layers 21 and 22, and thus the features of layer 21 are shown broken even though exposed by associated apertures in top layer 22.

In the embodiment of FIG. 2, slots 30 and 31 are formed in layers 21 and 22, respectively, to allow currents to be impressed in the area of the minor loops and in the area of the major loop selectively. A partitioning of layers 21 and 22 in this manner allows a short duty cycle to be realized and thus permits attractive power levels to be realized also.

Figure 3:
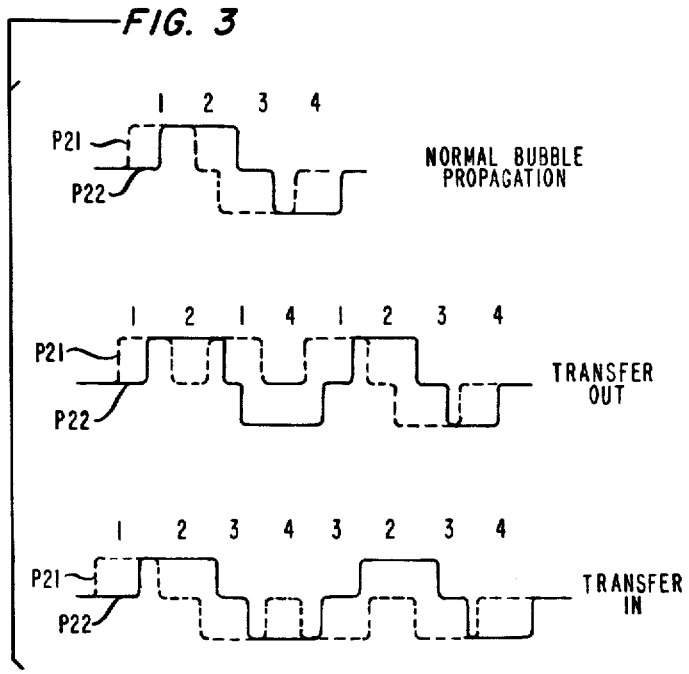
FIG. 3 is a pulse diagram of the operation of the memory of FIG. 1.

The movement of bubbles in response to a pulse train in layers 21 and 22 progresses along the sequence of positions designated 1-2-3 and 4- to correspond to the propagation pulse sequence as shown in my above-mentioned patent application and as represented in FIG. 3 by the pulse forms P21 and P22. Bubble movement can be seen to occur, for example, in a counterclockwise direction about minor loop $ML_{M+2}$ as indicated by the curved arrows there. Similarly, bubble movement is in a counterclockwise direction around major loop 11. Remember that the pulse sequence shown can be impressed selectively in the subportions of layers 21 and 22, and thus bubble movement can occur in the minor loops or the major loop or both. The provision of suitable pulses is discussed in my abovementioned application. A suitable drive is represented by block 40 in FIG. 1. The provision of the pulses selectively as described is controlled by a control circuit also operative to interrogate the detector arrangement and to synchronize the propagation and transfer circuits in a manner now well understood in the art. A control circuit is represented by block 41 in FIG. 1.

Now we will direct our attention to the transfer operation in the context of a conductor access, bubble memory as shown in FIG. 2 having partitioned electrically conducting layers. The transfer operation is permitted by the presence of associated apertures in layers 21 and 22 which apertures are illustratively concentric and of smaller and larger dimensions respectively. Such an arrangement of aperture is represented at each of locations 50, 51, 52, and 53 in FIG. 2.

Consider location 50. For an 8 micron period circuit, aperture 54 has dimensions of 8×2.5 microns and aperture 55 has dimensions of 4×2 microns. A bubble for such a circuit has a nominal diameter of 1.6 microns. A bubble in loop $ML_{M+2}$ approaches aperture 57, moving to position 4 in normal sequence when a pulse sequence modification occurs for a transfer out-operation. The modified pulse sequence is 1-2-3-4-1A-2A-1A-4A-1B-2B, the letter designations being shown in FIG. 2. The normal sequence thereafter carries a transferred bubble to positions 1-2-3-4- associated with apertures 60 and 61.

Note that the so-transferred bubble passes slots 31 and 30 in sequence during the transfer operation. Therefore, both portions of layers 21 and layers 22 necessarily are pulsed electrically in parallel to effect the above transfer. An additional cycle of operation moves the bubble to position 4 of aperture 63, a position which can be seen to lie in the major loop along which the bubble moves to the right as viewed in response to later cycles of operation. The transfer-out operation is now complete, the path of bubble movement during that operation being represented by arrow 65 in FIG. 2.

Of course, a bubble (or no bubble) is similarly moved, in parallel, from each like position in another of the minor loops as can be appreciated by comparing the geometry of location 51 with that of 50. Consequently, major loop 11 ultimately includes a bubble pattern from the bit location in the minor loops corresponding to those which occupy the transfer locations when a transfer operation occurs.

Propagation currents need be applied thereafter only to those portions of layers 21 and 22 which are associated with the major loop. In this manner data may be moved to the detector and back to the transfer locations while data in the minor loops remain unmoved. The requisite amount of power required for operation is thus reduced.

In accordance with the embodiment of FIG. 2, data, once detected at 13 of FIG. 1 is moved back to the transfer location for transfer into the originating bit locations which are positioned to accept the data. Since four cycles of propogation are employed to complete a transfer operation of a bubble from say position 1 at aperture 70 to position 4 at aperture 71, the originating positions in the minor loops are stepped back to positions four cycles removed from position 1 at aperture 71 in order to synchronize the transferred bubbles and the vacancies.

When that data generated at 12 moves to positions 4c at, for example, apertures 52 and 53, a transfer-in operation commences. The transfer-in operation is explained in connection with a bubble initially at position 1 at aperture 70 in major loop 11. The destination of the bubble is position 3 at aperture 71 in minor loop $ML_{M+2}$ in FIG. 2. The path of bubble movement during the transfer in operation is represented by arrow 72 in FIG. 2.

The transfer-in pulse sequence, applied to all portions of layers 21 and 22 is 1-2-3c-4c- 3c-2c-3d-4-1-2 where 2c is at aperture 52. Position 3c is associated with aperture 73 (in layer 21). Position 2c is associated with aperture 52 (in layer 22). The sequence 1-2-3c-4c-3c-2c-3d and 4 can be seen to be equivalent, essentially, to a normal propagation sequence (cycle) three subsequent cycles resulting in movement of the bubble to its desired destination. As described above, bubbles in like positions in the major loop (see aperture 53) similarly move to their respective minor loop destinations. The operation is now complete.

Control circuit 41 may now impress a pulse sequence in the portions of layers 21 and 22 associated with the minor loops to move a next selected address to the transfer locations. The pulses required for transfer are impressed simultaneously in both portions of each of layers 21 and 22, but merely shuttle bubbles in positions outside the transfer locations in a negligible manner. These pulses are applied to a transfer conductor 78 by a transfer circuit represented by block 79 of FIG. 1. Once the data is in the major loop, data in the minor loops may reamin unmoved as mentioned hereinbefore.

The transfer-in operation occurs not only after data has been detected but also when new data is being written. Input circuit 15 is adapted to generate a bubble pattern in the major loop in conventional fashion under the control of control circuit 41 by applying appropriate current pulses to a conductor 80 of FIG. 1 during desired cycles of operation for forming a data stream. Conductor 80 conveniently is adapted to couple other stages of the major loop to annihilate detected data which newly written data is intended to replace. Alternatively, separate annihilate conductor and pulse sources may be used.

FIG. 3 shows the first, second, and third pulse sequences for normal bubble propagation, transfer-out, and transfer-in, respectively. The broken pulse forms are designated P21 and are impressed in layer 21 of the illustrative embodiment. The solid pulse forms represent the currents impressed in layer 22. The normal pulse sequence of 1-2-1-4-1-2-3-4 can be seen to correspond with the notations in FIG. 2 for normal bubble movement. The second sequence of 1-4-1-2 can be seen to correspond to the crucial portion of the transfer-out operation as can the sequence of -3-2-3-4 be seen to correspond to the crucial portion of the transfer-in operation. Circuitry operative to apply the proper pulse sequences is straightforward and considered to be included in control circuit 41 for controlling driver 40 of FIG. 1. The circuits may be any such circuits capable of operating in accordance with this invention. As may be observed from the designation in FIG. 2, the second and third pulse sequences only negligibly shuttle nontransferred data between positions from which normal bubble propagation continue movement at the conclusion of the transfer operation.

An ion-implanted layer usually is included in the bubble layer 20 to suppress hard bubbles as is in common use in the art. With the dual-conductor technology, it is advantageous to form the ion-implanted layer at the lower surface of layer 20 next to the substrate on which layer 20 is formed. Such a subterranean ion-implanted layer suppresses hard bubbles but does not act to reduce the coupling between the conductor layers and the bubbles.

Although, FIG. 1 shows the memory chip as being essentially square, consideration of preferred impedance characteristics dictate a rectangular geometry for the chip. Of course, the conductor layers can be formed to provide a folded geometry for the current paths to achieve a relatively square chip while retaining attractive impedance characteristics.

The illustrative embodiment calls for a shuttling of the transferred bubbles during the transfer operation as is clear from an examination of the transfer-in and transfer-out pulse sequence. The shuttling is not necessary but has been found to enable improved operating margins to be obtained. Also, the invention has been described in terms of apertures through each of layers 21 and 22. The apertures cause localized impedance changes in the conducting layers and such changes can be achieved in alternative ways. For example, the apertures may be openings through the conducting layer, just indentations in the layer or, alternatively, the conducting layers may perhaps be oxidized locally.

Moreover, the transfer location, as shown, comprises nested apertures which illustratively are concentric. The aperture need not be concentric. They need only be of a shape and disposed with respect to one another to allow field gradients to be generated along first and second paths in response to first and second pulse sequences respectively.

The illustrative embodiment includes a set of minor loops to each side of the major loop in a symmetrical arrangement. Such a symmetrical arrangement results in balanced fields, at major loop 11, associated with the current drives and acts to reduce any field imbalance which would produce a vector normal to layer 20.

What has been described is considered merely illustrative of the principles of this invention. Therefore, those skilled in the art can devise modifications of the embodiments described herein in accordance with the invention within the spirit and scope thereof as now claimed.

I claim:

1. A magnetic bubble memory comprising a host layer of material in which magnetic bubbles can be moved, and means for defining in said layer at least first and second multistage paths for magnetic bubbles, a transfer location adapted for moving bubbles from said first to said second path, said paths and said transfer location being defined by first and second patterns of associated apertures in first and second layers of electrically conducting material adjacent said host layer, associated ones of said apertures in said first and second layers being offset from one another in a manner to generate changing patterns of magnetic field gradients for moving bubbles along said paths synchronously in response to a first pulse sequence applied to said first and second layers, said apertures at said transfer location having geometries and being disposed with respect to one another to generate magnetic field gradients along said first path and from said first to said second path in response to first and second pulse sequences respectively.

2. A magnetic bubble memory in accordance with claim 1 wherein said apertures at said transfer location are relatively small and relatively large in said first and second layers respectively said relatively small aperture being encompassed by said relatively large aperture.

3. A magnetic bubble memory in accordance with claim 2 wherein said first and second paths are closed loop paths.

4. A magnetic bubble memory in accordance with claim 2 including a plurality of said first paths wherein said first paths are all closed loops and a transfer location associated with each of said first paths.

5. A magnetic bubble memory in accordance with claim 4 wherein said second path also comprises a closed loop and wherein a second transfer location is associated with each of said first transfer location, and means for selectively moving bubbles at said first and second transfer locations from said first paths to different stages of said second path and from different stages of said second path to different ones of said first paths responsive to second and third pulse sequences respectively.

6. A magnetic bubble memory in accordance with claim 5 wherein each of said first and second layers is partitioned into first and second portions corresponding to said first paths and to said second path respectively and means for applying said first, second, and third pulse sequences to said first portions of said first and second layers and to said second portions of said first and second layers selectively.

7. A magnetic bubble memory comprising a host layer of material in which magnetic bubble can be moved and means for moving magnetic bubbles in the layer, the means comprising first and second layers of electrically conducting material including first and second sets of like apertures respectively for defining at least first and second paths for moving magnetic bubbles therealong in response to a first pulse sequence impressed in the layers, the memory being CHARACTERIZED IN THAT the first and second layers also include relatively small and large apertures respectively, for defining a transfer location the small aperture being positioned to be encompassed by the large aperture, the transfer location being responsive to a second pulse sequence to move a bubble from the second to the first path.

8. A magnetic bubble memory in accordance with claim 5 or claim 7 wherein said relatively small and large apertures are oval and have a common center.

* * * * *